(12) United States Patent
Ishikawa et al.

(10) Patent No.: US 11,037,616 B2
(45) Date of Patent: Jun. 15, 2021

(54) APPARATUSES AND METHODS FOR REFRESH OPERATIONS IN SEMICONDUCTOR MEMORIES

(71) Applicant: MICRON TECHNOLOGY, INC., Boise, ID (US)

(72) Inventors: Toru Ishikawa, Kanagawa (JP); Shinji Bessho, Tokyo (JP); Takuya Nakanishi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 49 days.

(21) Appl. No.: 16/220,215

(22) Filed: Dec. 14, 2018

(65) Prior Publication Data

US 2020/0194057 A1 Jun. 18, 2020

(51) Int. Cl.
| | |
|---|---|
| *G11C 11/40* | (2006.01) |
| *G11C 11/406* | (2006.01) |
| *G11C 7/10* | (2006.01) |
| *G11C 11/4096* | (2006.01) |
| *G11C 11/408* | (2006.01) |

(52) U.S. Cl.
CPC ........ *G11C 11/40618* (2013.01); *G11C 7/106* (2013.01); *G11C 7/1063* (2013.01); *G11C 11/4085* (2013.01); *G11C 11/4096* (2013.01); *G11C 11/40615* (2013.01)

(58) Field of Classification Search
CPC .......... G11C 11/40618; G11C 11/4096; G11C 7/1063; G11C 11/4085; G11C 7/106; G11C 11/40615
See application file for complete search history.

(56) References Cited

U.S. PATENT DOCUMENTS

| | | |
|---|---|---|
| 10,706,909 B2 | 7/2020 | Bessho et al. |
| 2012/0151131 A1 | 6/2012 | Kilmer et al. |
| 2012/0307582 A1 | 12/2012 | Marumoto et al. |
| 2013/0028038 A1* | 1/2013 | Fujisawa .............. G11C 7/222 365/222 |

(Continued)

OTHER PUBLICATIONS

U.S. Appl. No. 16/201,593 titled "Apparatuses and Methods for Refresh Operations Including Multiple Refresh Activations" filed Nov. 27, 2018; pp. all.

(Continued)

*Primary Examiner* — Mohammed A Bashar
(74) *Attorney, Agent, or Firm* — Dorsey & Whitney LLP

(57) ABSTRACT

A system for refresh operations in semiconductor memories, and an apparatus and method therefore, are described. The system includes, for example, memory cells in memory banks that are refreshed during a self-refresh operation or an auto refresh operation. The self-refresh operation includes a different number of refresh activations than the auto refresh operation. The system further includes a row control circuit configured to refresh the memory cells in the memory banks based on refresh control signals received from a refresh control circuit, the refresh control signals provided by the refresh control circuit based on internal control signals received by the refresh control circuit from a command control circuit. The auto refresh operation includes a per bank refresh operation configured to refresh a corresponding memory bank or an all-bank refresh operation configured to refresh all memory banks.

20 Claims, 9 Drawing Sheets

(56) References Cited

U.S. PATENT DOCUMENTS

2014/0185403 A1    7/2014   Lai
2017/0062038 A1    3/2017   Doo et al.
2019/0189194 A1    6/2019   Kim et al.
2020/0168268 A1    5/2020   Bessho et al.
2020/0294578 A1    9/2020   Bessho et al.

OTHER PUBLICATIONS

U.S. Appl. No. 16/890,529, titled "Apparatuses and Methods for Refresh Operations Including Multiple Refresh Activations", dated Jun. 2, 2020.

\* cited by examiner

APPARATUSES AND METHODS FOR REFRESH OPERATIONS IN SEMICONDUCTOR MEMORIES

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory controllers have progressed to accommodate memory components with decreased size, the refresh control techniques have improved but also increased in complexity, resulting in the need for more efficient refresh operations to complete refreshing the memory cells of a memory array. Various approaches to refreshing the memory cells in an efficient and flexible manner have been developed, and continue to be developed due to the need for improved memory performance.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
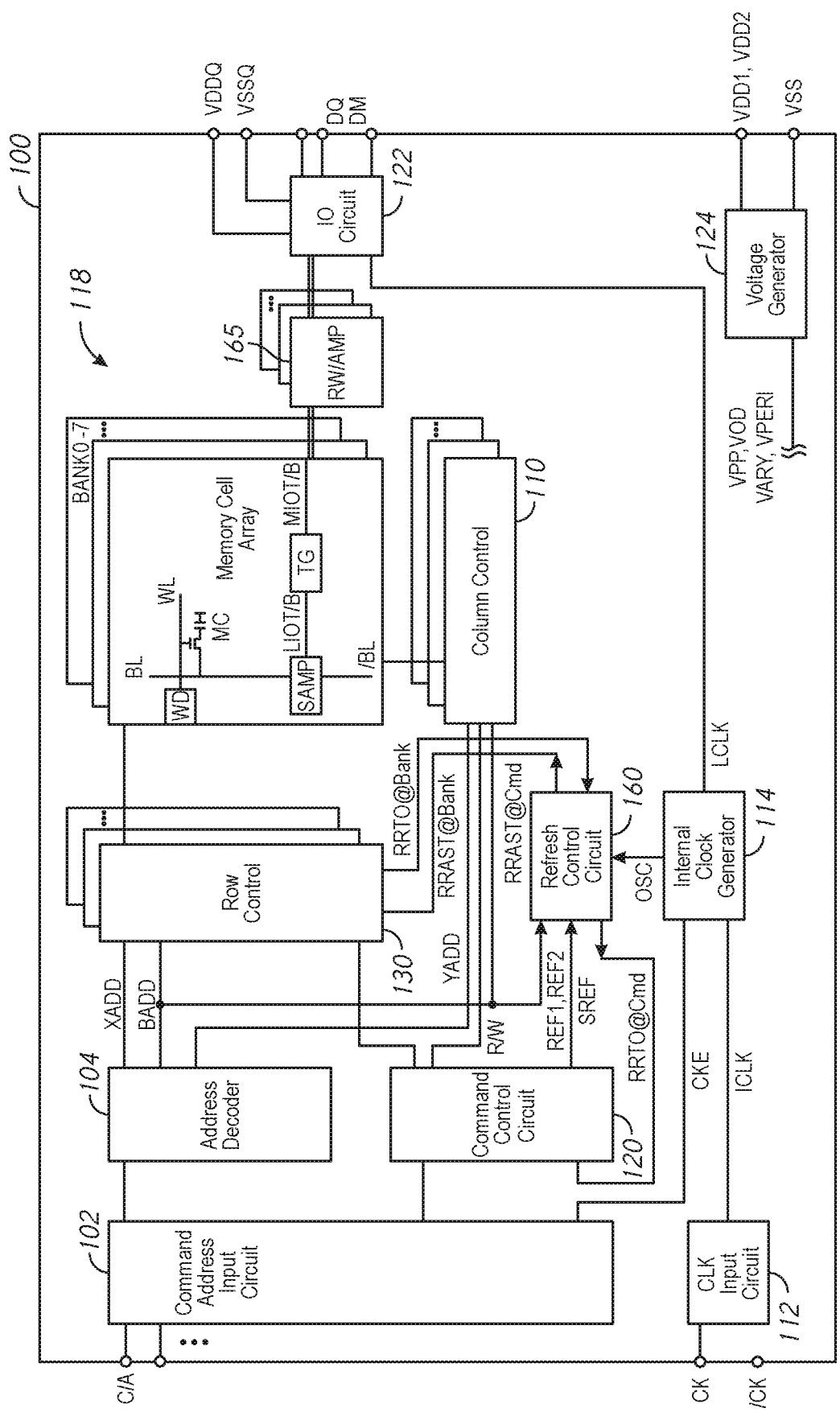
FIG. 1 is a block diagram of a semiconductor device according to an embodiment of the present disclosure.

FIG. 1 is a block diagram showing an overall configuration of a semiconductor device according to at least one embodiment of the disclosure. The semiconductor device 100 may be a semiconductor memory device, such as a DRAM device integrated on a single semi conductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row control circuit 130 and word driver WD, which activates the selected word line WL. The selection of the bit lines BL and /BL is performed by a column control circuit 110. In the embodiment of FIG. 1, the row control circuit 130 includes a respective row control circuit for each memory bank and the column control circuit 110 includes a respective column control circuit for each memory bank. The bit lines BL and /BL are coupled to a respective sense amplifier (SAMP). Read data from the bit line BL or /BL is amplified by the sense amplifier SAMP, and transferred to read/write amplifiers 165 over complementary local data lines (LIOT/B), transfer gate (TG), and complementary main data lines (MIOT/B). Conversely, write data outputted from the read/write amplifiers 165 is transferred to the sense amplifier SANTP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ and DM to transfer and mask data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command control circuit 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 for timing operation of circuits included in the input/output circuit 122, for example, to data receivers for timing receipt of write data. The internal clock generator 114 may also include an oscillator that provides an oscillation signal OSC. The oscillator signal may be based on the ICLK clock and/or the LCLK clock, or another clock.

The C/A terminals may be supplied with memory commands and memory addresses. The memory addresses supplied to the C/A terminals are transferred, via a command/address input circuit 102, to an address decoder 104. The address decoder 104 receives the address and supplies a decoded row address XADD to the row control circuit 130 and supplies a decoded column address YADD to the column control circuit 110. The address decoder 104 may also supply a decoded bank address BADD, which may indicate the memory bank of the memory array 118 containing the decoded row address XADD and column address YADD. Examples of commands include access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal control signals to a command control circuit 120 via the command/address input circuit 102. The command control circuit 120 includes circuits to decode the internal control signals to generate various internal signals and commands for performing operations. For example, the command control circuit 120 may provide a row command signal to select a word line and a column command signal to select a bit line.

The device 100 may receive an access command, for example, a read command. When a read command is received, and a bank address, a row address and a column address are timely supplied with the read command, read data is read from memory cells in the memory array 118 corresponding to the row address and column address. The read command is received by the command control circuit 120, which provides internal commands so that read data from the memory array 118 is provided to the read/write amplifiers 165. The read data is output to outside from the data terminals DQ via the input/output circuit 122.

The device 100 may receive an access command, for example, a write command. When the write command is received, and a bank address, a row address and a column address are timely supplied with the write command, write data supplied to the data terminals DQ is written to memory cells in the memory array 118 corresponding to the row address and column address. The write command is received by the command control circuit 120, which provides internal commands so that the write data is received by data receivers in the input/output circuit 122. Write docks may also be provided to the external clock terminals for timing the receipt of the write data by the data receivers of the input/output circuit 122. The write data is supplied via the input/output circuit 122 to the read/write amplifiers 165, and by the read/write amplifiers 165 to the memory array 118 to be written into the memory cell MC.

The device 100 may undergo periodic refreshing in order to retain data stored by the memory. The refreshing may include a first type of refresh operation with a first number of refresh activations, and a second type of refresh operation with a second number of refresh activations. For example, the number of refresh activations of the first type of refresh operation may be less than the number of refresh activations of the second type of refresh operation in some embodiments. The first type of refresh operation may be a self-refresh operation and the second type of refresh operation may be an auto refresh operation. In some embodiments, the self-refresh operation may include one refresh activation and the auto refresh operation may include two refresh activations.

The device 100 may be refreshed by periodically issuing refresh commands to the memory, or by providing a self-refresh command that controls the semiconductor device 100 to enter into a "self-refresh" state. For example, refresh commands can be issued in between memory operations, such as between read and write operations.

In a self-refresh state, the memory manages refresh operations for itself using self-refresh circuitry until the state is exited by receiving a self-refresh exit command. Self-refresh is often used while the memory is in a stand-by state and is inactive, and no memory operations are in process or are pending. The clock enable signal CKE controls whether the semiconductor memory device is inactive (e.g., CKE having a logic low level). In the self-refresh operation mode (e.g., while the clock enable signal CKE is at the logic low level) the refresh operations are performed in accordance with the oscillator signal, such as an oscillator signal OSC from a signal generation circuit (e.g., an oscillator), in the semiconductor memory device. As previously discussed the internal clock generator 114 may include an oscillator to provide the oscillator signal OSC. When the clock enable signal CKE becomes inactive (e.g., transition to the logic low level), the semiconductor memory device activates the oscillator to generate an internal refresh signal responsive to the oscillator signal in the self-refresh operation mode, and refresh operations are performed in synchronism with the internal refresh signal.

The device 100 may receive commands causing it to carry out refresh operations. The command may cause the device 100 to catty out a self-refresh operation including refresh operations for all or less than all of the memory banks, carry out an auto refresh operation including refresh operations for all of the memory banks (e.g., all-bank refresh operation), or carry out an auto refresh operation including refresh operations for one or more (but less than all) of the memory banks (e.g., per bank refresh operation). The command control circuit 120 decodes such commands and provides, to a refresh control circuit 160, an internal control signal SREF for a self-refresh operation, or internal control signals REF1 and REF2 for an auto refresh operation. The internal control signal SREF for a self-refresh operation may be provided responsive to an oscillator pulse provided by a self-refresh oscillator. The internal control signals REF1 and REF2 for an auto refresh operation may be provided by the command control circuit 120 responsive to control signals received from outside the command control circuit 120. The memory bank(s) refreshed for a per bank auto refresh operation are identified by the bank address BADD provided to the refresh control circuit 160 from the address decoder 104.

The refresh control circuit 160 provides and receives various internal control signals to perform refresh operations. For example, control signals RRAST are provided to the row control circuit 130. The control signals provided from the refresh control circuit 160 are designated as control signals RRAST@Cmd and the control signals received at the row control circuit 130 are designated as control signals RRAST@Bank. The refresh control circuit 160 receives, for example, control signals RRTO from the row control circuit 130 and provides control signals RRTO to the command control circuit 120. The control signals received at the refresh control circuit 160 from the row control circuit 130 are designated as control signals RRTO@Bank and the control signals provided by the refresh control circuit 160 to the command control circuit 120 are designated as control signals RRTO@Cmd.

Refresh operations are performed over a refresh cycle. The command control circuit 120 and refresh control circuit 160 provide the SREF signal, the REF1 and REF2 signals, and the RRAST signals and RRTO signals, respectively, having a timing that performs refresh operations within the refresh cycle. The command control circuit 120 and refresh control circuit 160 provide the control signals to have refresh activations within a refresh cycle for the self-refresh operation and the auto refresh operation. In some embodiments of the disclosure, the control signals may be provided by the command control circuit 120 and refresh control circuit 160 to have a single refresh activation within a refresh cycle for the self-refresh operation and two consecutive refresh activations within a refresh cycle for the auto refresh operation. The refresh activation for the refresh cycle of different refresh operations of the self-refresh operation type may be used to refresh different groups of memory cells (e.g., different rows of memory cells). Each of the refresh activations for the per bank or the all-bank auto refresh operation may be used to refresh different groups of memory cells (e.g., different rows of memory cells).

The command control circuit 120 and the refresh control circuit 160 provide control signals for timing refresh operations. For example, the command control circuit 120 and the refresh control circuit 160 provide the control signals for the auto refresh operation with sufficient timing control to perform multiple activations during a refresh cycle although timing margins may be small. The command control circuit 120 and the refresh control circuit 160 may also provide the control signals for the self-refresh operation with sufficient timing control to perform one or more refresh activations. However, in embodiments where the self-refresh operation includes one refresh activation, the command control circuit 120 and the refresh control circuit 160 may not need to provide the control signals for timing of a refresh activation subsequent to the one refresh activation.

In an embodiment of the disclosure, the command control circuit 120 and the refresh control circuit 160 for the self-refresh operation provide the SREF signal and the RRAST signals and RRTO signals to include one refresh activation within a refresh cycle (e.g., single pump refresh). All-bank auto refresh operations and/or per bank auto refresh operations may have multiple refresh activations for a refresh cycle. In an embodiment of the disclosure, the command control circuit 120 and the refresh control circuit 160 for the auto refresh operation provide the REF1 and REF2 signals, and the RRAST signals and RRTO signals to include two consecutive refresh activations within a refresh cycle (e.g., double pump refresh).

Including a single refresh activation for the self-refresh operation in comparison to the two refresh activations for the auto refresh operation reduces complexity of circuitry required for performing the self-refresh operation. For example, there is no interruption required for the self-refresh operation since the time required to perform the single refresh activation may be less than a maximum amount of time allotted for the self-refresh operation. In some embodiments of the of the disclosure, multiple refresh activations for a refresh cycle for the auto refresh operation may allow for insertion of additional refresh operations that may be advantageously "hidden" in the refresh cycle. In another example, the additional refresh activations hidden in the refresh cycle during the auto refresh operation may be used to refresh memory affected by a row hammer effect. Such hidden refresh operations during the auto refresh operation may be beneficial for avoiding the necessity of performing the additional refresh operations during the self-refresh operation. The absence of additional refresh operations performed during the self-refresh operation ensures that the time required to perform the single refresh activation of the self-refresh operation is less than the allotted amount of time.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row control circuit 130, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
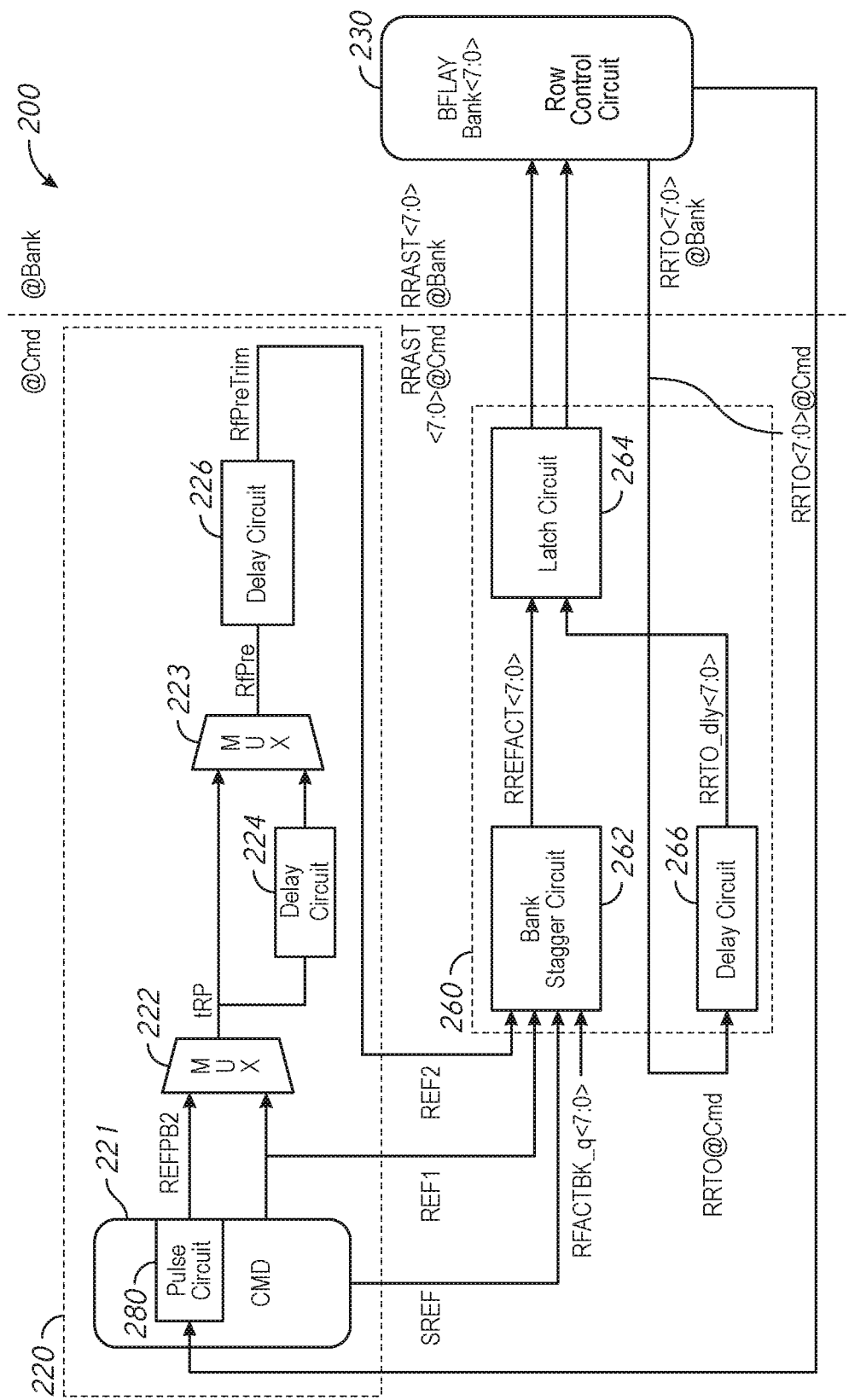
FIG. 2 is a block diagram of a refresh control path according to an embodiment of the disclosure.

FIG. 2 is a block diagram of a refresh control path 200 according to an embodiment of the disclosure. The refresh control path 200 includes circuits from a command control circuit 220, a refresh control circuit 260, and row control circuit 230. In some embodiments of the disclosure, the command control circuit 220, refresh control circuit 260, and/or row control circuit 230 may be included in part or in whole in the command control circuit 120, refresh control circuit 160, and/or row control 130 of FIG. 1.

The command control circuit 220 includes a command circuit 221 that The command circuit 221 provides internal control signals to internal circuits. The internal control signals provided by the command circuit 221 may be based, for example, on decoded commands, other internal control signals, etc. For example, the command circuit 221 provides a refresh control signal SREF, which may be an internal refresh command for a self-refresh operation (SREF), as determined from an oscillator signal produced by an oscillator (not shown in FIG. 2). The command circuit 221 includes a pulse circuit 280. The pulse circuit 280 provides an active pulse (e.g., positive pulse) when receiving a signal transitioning from a high logic level to a low logic level. The command control circuit 220 includes a multiplexer circuit 222 that receives from the command circuit 221 a first refresh control signal REF1, which may be a refresh command for a per bank refresh operation (REFPB) or an all-bank refresh operation (REFAB), as determined from the decoded commands. The multiplexer circuit 222 further receives from the command circuit 221 a second loop per bank refresh control signal REFPB2. The multiplexer 222 is controlled, for example, by the command circuit 221, to provide the REF1 signal or the REFPB2 signal as a control signal tRP.

The tRP signal is provided to a multiplexer 223 and to a bank refresh command delay circuit 224. The delay circuit 224 provides delayed bank refresh control signals for refresh operations for the memory banks. The delay circuit 224 provides the delayed bank refresh control signals to the multiplexer 223. The multiplexer 223 is controlled, for example, by the command circuit 221, to provide the tRP signal or the delayed bank refresh control signals as refresh control signal RfPre to a delay circuit 226. The delay circuit 226 delays the RfPre signal by a delay to provide a trimmed RfPre signal RfPreTrim. The delay circuit 226 provides delay to the RfPre signal so that the timing of the RfPreTrim signal provides time between consecutive refresh activations (e.g., refresh "pumps"), for example, to prepare circuits for refreshing memory cells (e.g., precharge and equalization of bit lines and sense amplifiers, threshold voltage compensation of sense amplifiers, etc.). The RfPreTrim signal is provided by the command control circuit 220 as a second refresh control signal REF2. The delay circuit 226 may be a trimmable delay (e.g., adjustable delay) that may be trimmed (e.g., adjusted) to provide a desirable delay to the RfPre signal in providing the RfPreTrim signal. The delay circuit 226 may be trimmed, for example, by programming fuses/antifuses, providing control signals, etc. The delay circuit 226 may be trimmable to provide greater control over the timing of the control signals of the refresh control path. For example, the delay circuit 226 may be trimmed to have a delay that provides desirable timing between the end of a previous refresh activation and a start of a subsequent refresh activation for refresh operations that include multiple refresh activations.

The refresh control circuit 260 receives the SREF signal for self-refresh operations and the REF1 and REF2 signals for auto refresh operations from the command control circuit 220. Some embodiments of the disclosure include different modes for self-refresh operations. For example, self-refresh operations may include a slow exit mode and a fast exit mode. In some embodiments of the disclosure, all memory banks are refreshed for the slow exit mode and for the fast exit mode. A bank stagger circuit 262 receives the SREF signal, and the REF1 and REF2 signals, and provides activation signals RREFACT in response. Typically, a respective RREFACT signal is provided for each memory bank. The bank stagger circuit 262 is further provided control signals RFACTBK_q, which are based on a bank address.

When the REF1 and REF2 signals related to refresh operations for all memory banks (e.g., all-bank refresh) or the SREF signal related to self-refresh operations (e.g., all memory banks will be self-refreshed) are provided, the bank stagger circuit 262 provides the RREFACT signals staggered in time so that each RREFACT signal has a timing that is shifted relative to the other RREFACT signals. In contrast, when the REF1 and REF2 signals are related to refresh operations for one or more memory banks, but less than all of the banks for memory (e.g., per bank refresh), the bank stagger circuit 262 does not stagger the RREFACT signals. In such a case, the bank stagger circuit 262 provides the RREFACT signals including an active RREFACT signal corresponding to the memory bank(s) identified by the RFACTBK_q signals, that is, the memory bank(s) in which the refresh operation is to be performed. The RREFACT signals are provided to latch circuits 264.

The latch circuits 264 may include several latch circuits, typically, one latch circuit for an associated memory bank. Each of the latch circuits 264 provides a respective control signal RRAST to the row control circuit 230. The refresh control circuit 260 further includes a delay circuit 266. The delay circuit 266 receives control signals RRTO from the row control circuit 230 and delays the RRTO signals to provide the control signals RRTO_dly. The delay circuit 266 may be a trimmable delay (e.g., adjustable delay) that may be trimmed (e.g., adjusted) to provide a desirable delay to the RRTO signal. The delay circuit may be trimmed, for example, by programming fuses/antifuses, providing control signals, etc. The delay circuit 266 may be trimmable to provide greater control over the timing of the control signals of the refresh control path. For example, the delay circuit 266 may be trimmed to have a delay that provides desirable timing between multiple refresh activations for refresh operations that include multiple refresh activations (e.g., per bank and all-bank auto refresh). Each of the RRTO_dly signals is provided to a respective one of the latch circuits 264. As will be described below, an active RREFACT signal (e.g., active high logic level) from the bank stagger circuit 262 causes the respective latch circuit 264 to set and provide an active RRAST signal (e.g., active high logic level), and an active RRTO_dly signal (e.g., active high logic level) from the delay circuit 266 causes the respective latch circuit 264 to reset and provide an inactive RRAST signal (e.g., inactive low logic level).

The row control circuits 230 include several row control circuits, typically, one row control circuit for an associated memory bank. Each of the row control circuits 230 activates memory cells of a corresponding memory array (e.g., activates a row of memory cells) when an active RRAST signal is provided by the respective latch circuit 264 of the refresh control circuit 260. Activation of the memory cells causes the memory cells to be refreshed. Each of the row control circuit 230 additionally provides an RRTO signal to a respective delay circuit 266 in response to receiving the respective active RRAST signal. Each row control circuit 230 provides an active RRTO signal (e.g., active high logic level) to a respective delay circuit 266 in response to receiving the respective active RRAST signal and each of the row control circuits 230 provides an inactive RRTO signal (e.g., inactive low logic level) to the command control circuit 220 when a respective inactive RRAST signal is received. The inactive RRTO signal is provided to the pulse circuit 280 in the command circuit 221, which may provide the REFPB2 signal to the multiplexer 222.

In some embodiments of the disclosure, eight memory banks are included. As a result, the bank stagger circuit 262 receives eight RFACTBK_q signals (RFACTBK_q<7:0>) and provides eight RREFACT signals (RREFACT<7:0>), the latch circuits 264 provide eight RRAST signals (RRAST<7:0>), the row control circuits 230 provide eight RRTO signals (RRTO<7:0>), and the delay circuits 260 provide eight RRTO_dly signals (RRTO_dly<7:0>). Other embodiments of the disclosure may include a greater or fewer number of memory banks and the circuits provide a corresponding greater or fewer number of control signals. The scope of the disclosure is not limited to a particular number of memory banks or control signals.

Figure 3:
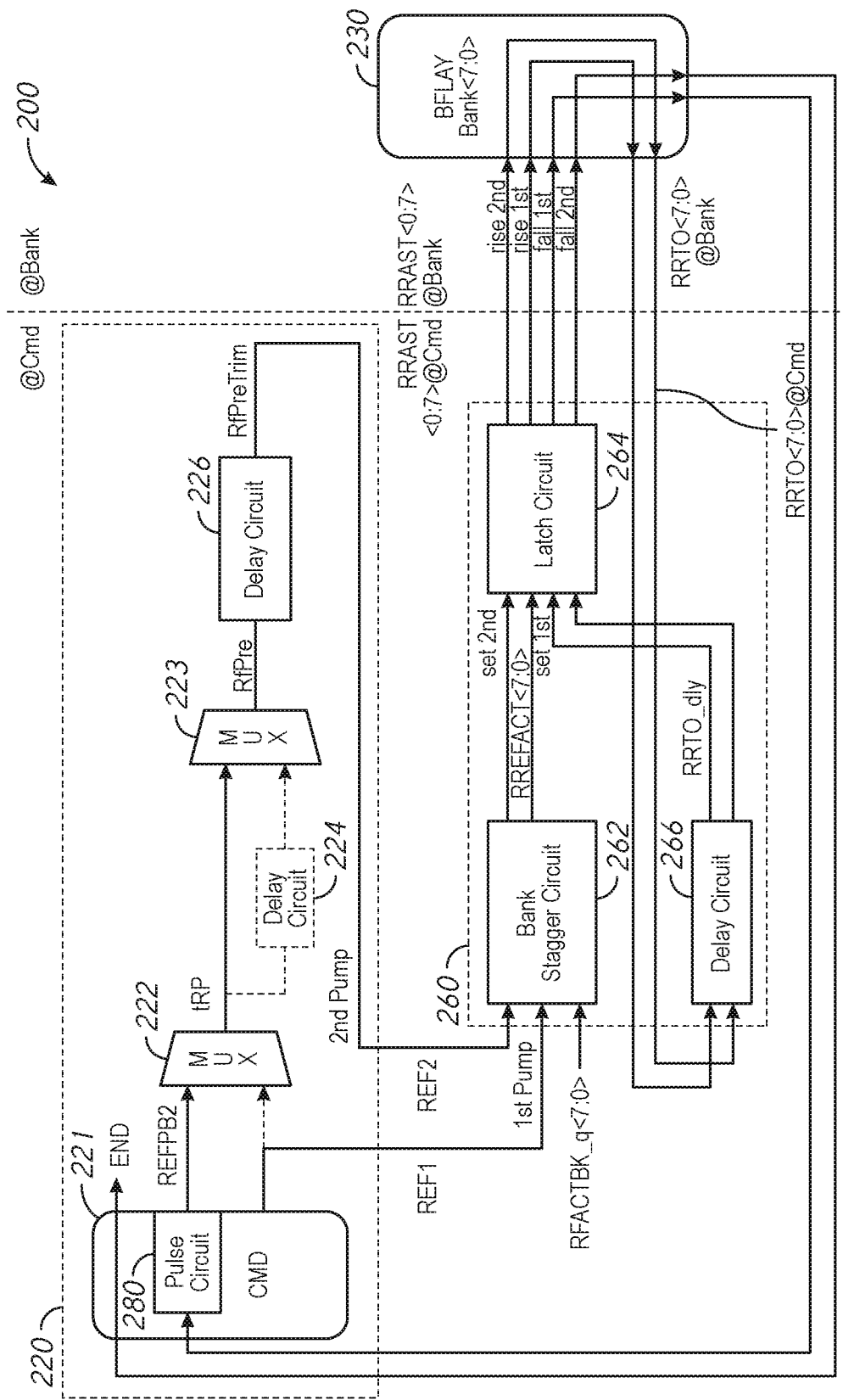
FIG. 3 is a diagram of various control signals of a refresh control path for a per bank auto refresh operation according to an embodiment of the disclosure.
Figure 4:
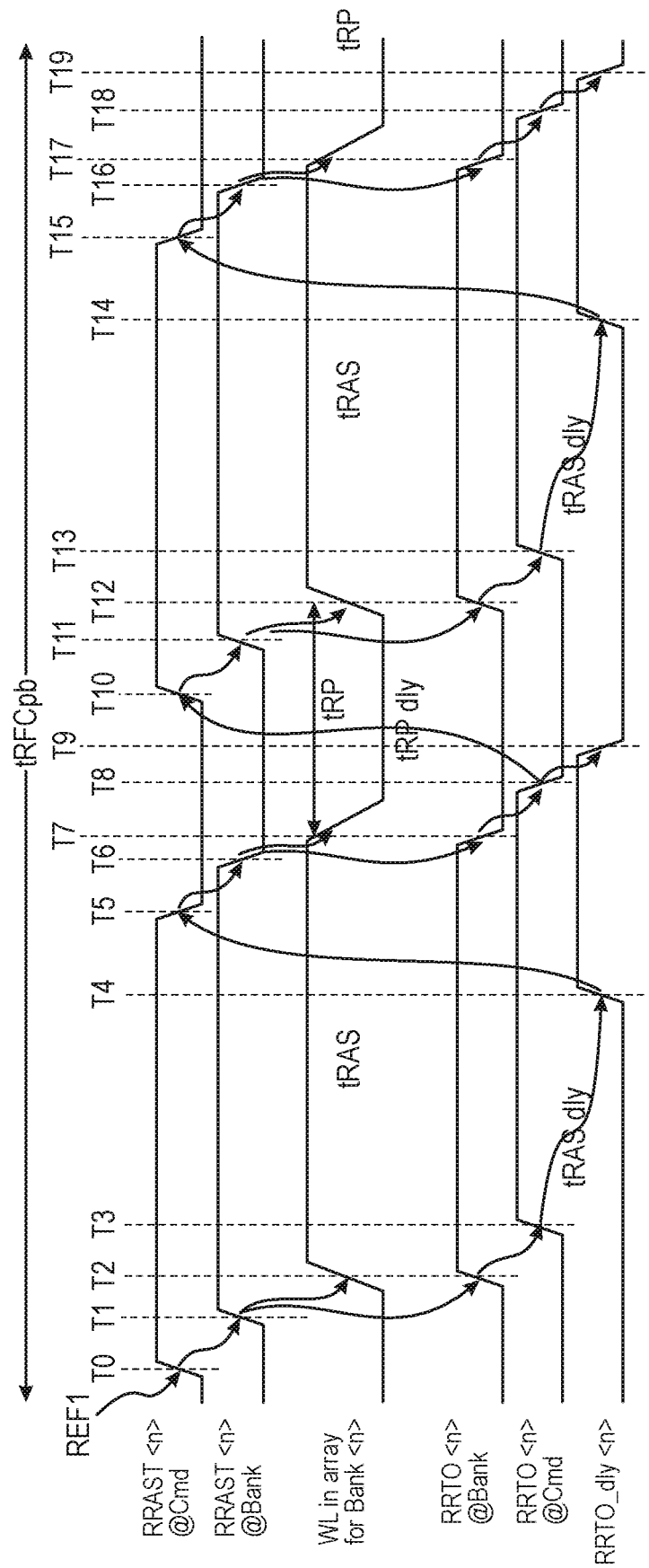
FIG. 4 is a timing diagram of various control signals of a refresh control path for a per bank auto refresh operation according to an embodiment of the disclosure.

A per bank auto refresh operation according to an embodiment of the disclosure will be described with reference to FIGS. 3 and 4. FIG. 3 is a diagram of various control signals of a refresh control path for a per bank auto refresh operation according to an embodiment of the disclosure. FIG. 4 is a timing diagram of the various control signals of the refresh control path according to an embodiment of the disclosure. The example per bank auto refresh operation of FIGS. 3 and 4 will be described with reference to the refresh control path 200. However, other refresh control paths may be used in some embodiments of the disclosure.

The per bank refresh operation may be performed by the refresh control path 200 to refresh a specified memory bank. In some examples, the per bank refresh operation may be performed by the refresh control path 200 to refresh one of eight memory banks included in a memory array. During the per bank refresh operation, other memory banks not being refreshed may be accessed with a command other than the refresh command by a memory controller.

The per bank refresh operation performed by the refresh control path 200 may be a double-pump per bank refresh operation including a first refresh activation (e.g., first refresh "pump") and a second refresh activation (e.g., second refresh "pump").

In operation, a per bank refresh operation is initiated when a decoded per bank refresh command causes the command circuit 221 of the command control circuit 220 to provide an active REF1 signal to the bank stagger circuit 262 of the refresh control circuit 260. The active REF1 signal causes the bank stagger circuit 262 to provide the RREACT signals (without stagger due to the per bank refresh operation) including an active RREFACT signal corresponding to at least one memory bank identified by the RFACTBK_q signals. The RREFACT signals are provided to respective ones of the latch circuits 264. The active RREFACT signal causes the respective latch circuit 264 to provide an active RRAST@Cmd signal (shown in FIG. 4 as RRAST<n>@Cmd where "n" represents a specific one of multiple RRAST@Cmd signals). The other latch circuits 264 provide inactive RRAST@Cmd signals. Each of the RRAST@Cmd signals is provided to a respective one of the row control circuits 230, which is received as a respective RRAST@Bank signal (shown in FIG. 4 as RRAST<n>@Bank). The RRAST@Cmd signal for a first refresh activation of a per bank refresh operation becomes active at time T0 as shown in FIG. 4, and the RRAST@Bank signal becomes active at time T1.

The row control circuit 230 that receives the active RRAST@Bank signal causes one or more memory cells (e.g., rows of memory cells) in a corresponding memory bank to be refreshed. A word line WL becomes active at time T2 in FIG. 4 to refresh one or more memory cells of the memory bank. The activation of the WL at time T2 represents refreshing the memory cells for the first refresh activation. The row control circuit 230 that receives the active RRAST@Bank signal also provides an active RRTO@Bank signal to the delay circuit 266 at time T2, which is received by the delay circuit 266 as an active RRTO@Cmd signal at time T3 (shown in FIG. 4 as RRTO<n>r@Cmd and RRTO<n>@Bank). The active RRTO@Cmd signal is delayed by the delay circuit 266 to provide the RRTO_dly signals, including an active RRTO_dly signal (shown in FIG. 4 as RRTO_dly<n>) corresponding to the active RRTO@Cmd signal. The RRTO city signal becomes active at time T4, after a delay of tRAS dly relative to when the RRTO@Cmd signal becomes active at time T3. In some embodiments of the disclosure, the delay of the delay circuit 266 provides the RRTO_dly signals with a timing that facilitates multiple refresh activations (pumps) for a refresh operation. As previously described, the delay circuit 266 may be a trimmable delay in some embodiments of the disclosure, which may be trimmed to provide a desirable tRAS dly delay.

The RRTO_dly signals are provided by the delay circuit 266 to the latch circuits 264, and the active RRTO_dly signal resets the respective one of the latch circuits 264. As a result, the latch circuits 264, including the reset latch circuit, provide the RRAST@Cmd signals including a RRAST@Cmd signal that changes from an active level to an inactive level, as shown in FIG. 4 at time T5. The active-to-inactive RRAST@Cmd signal is received by the respective row control circuit 230 as the RRAST@Bank signal which changes from an active level to an inactive level, as shown at time T6. The inactive RRAST@Bank signal causes the respective row control circuit 230 to deactivate the activated WL at time T7 to end the memory cell refresh of the first refresh activation. The inactive RRAST@Bank signal also causes the row control circuit 230 to provide a RRTO@Bank signal that changes at time T7 to an inactive level. The inactive level of the RRTO@Bank signal is received by the delay circuit 266 as an inactive RRTO@Cmd signal at time T8. The delay circuit 266, in turn, provides a RRTO_dly signal that changes to an inactive level at time T9. In some embodiments of the disclosure, the delay circuit 266 does not delay a falling edge (e.g., active-to-inactive transition) when providing the RRTO_dly signal. In such embodiments, the transition of the RRTO_dly signal to an inactive level responsive to the falling edge of the RRTO@Cmd signal is not delayed to the same extent as the earlier transition of the RRTO_dly signal to an active level responsive to the rising edge of the RRTO@Cmd signal (e.g., compare delay between times T8 and T9 for the falling edge to delay between times T3 and T4 for the rising edge).

Following the deactivation of one or more of the RRTO signals (e.g., RRTO@Bank, RRTO@Cmd, and/or RRTO_dly), a second refresh activation will be started. For example, responsive to the deactivation of one of the RRTO signals at times T7, T8, and/or T9, the RRAST@Cmd signal provided by the latch circuits includes an active RRAST@Cmd signal that represents a start of the second refresh activation.

In the example operation described with reference to the timing diagram of FIG. 4, the RRTO@Cmd signals, including the RRTO@Cmd signal that becomes inactive at time T8, are provided to the command circuit 221 of the command control circuit 220. The pulse circuit 280 receives the RRTO@Cmd signals, and due to the inactive RRTO@Cmd signal, the pulse circuit 280 provides an active pulse to the multiplexer 222. The multiplexer 222 is controlled to provide the active pulse as the tRP signal due to the per bank refresh operation. The tRP signal is provided to the multiplexer 223, which is controlled to provide the active tRP signal as an active RfPre signal due to the per bank refresh operation. The RfPre signal is provided to the delay circuit 226, which delays the active RfPre signal to provide an active RfPreTrim signal. In some embodiments of the disclosure, the delay of the delay circuit 226 provides the RfPreTrim signal with a timing that provides time between consecutive refresh activations to prepare circuits for refreshing memory cells (e.g., time between the first and second refresh activations). As previously described, the delay circuit 226 may be a trimmable delay in some embodiments of the disclosure, which may be trimmed to provide a desirable tRP dly delay.

The active RfPreTrim signal is provided by the delay circuit 226 to the bank stagger circuit 262 of the refresh control circuit as an active second refresh control signal REF2. The active REF2 signal causes the bank stagger circuit 262 to provide the RREFACT signals including an active RREFACT signal corresponding to the memory bank identified by the RFACTBK_q signals in the first refresh activation. The RREFACT signals are provided to respective ones of the latch circuits 264, and the active RREFEACT signal causes the respective latch circuit 264 to provide an active RRAST@Cmd signal. The active RRAST@Cmd signal for a second refresh activation of a per bank refresh operation is shown in FIG. 4 at time T10. Each of the RRAST@Cmd signals is provided by the latch circuits 264 to a respective one of the row control circuits 230, which is received as a respective RRAST@Bank signal. The RRAST@Bank signal is shown becoming active at time T11. The row control circuit 230 that receives the active RRAST@Bank signal causes one or more memory cells (e.g., rows of memory cells) in the corresponding memory bank to be refreshed. The activation of the WL at time T12 represents refreshing one or more memory cells of the memory bank for the second activation.

A WL is activated for the second refresh activation at a time (e.g., at time T12) relative to the deactivation of a WL for the first refresh activation (e.g., at time T7) that provides time tRP to prepare circuits for refreshing memory cells during the second refresh activation. For example, the time between deactivation of the WL for the first refresh activation and subsequent activation of the WL for the second refresh activation may provide time for circuits to prepare for precharging and equalizing bit lines and sense amplifiers, performing threshold voltage compensation for the sense amplifier, as well as performing other operations in preparation for refreshing memory cells.

The timing of the activation of the WL for the second refresh activation relative to the timing of the deactivation of the WL for the first refresh activation is based on the timing of when the second refresh activation begins. For example, the timing of activating the WL (e.g., at time T12) is based on the timing of when the RRAST@Cmd signal becomes active (e.g., at time T10). The time when the RRAST@Cmd signal becomes active is relative to when the RRTO signals from the first refresh activation become inactive. The RRTO signals become inactive following deactivation of the RRAST@Bank signal, which also results in deactivating the WL for a previous refresh activation. Thus, controlling a timing of when the RRAST@Cmd signal becomes active for a subsequent refresh activation relative to when the RRTO signals from the previous refresh activation become inactive controls a timing of when the WL is activated for the subsequent refresh activation relative to when the WL is deactivated for the previous refresh activation.

For example, as previously described in the example operation described with reference to FIG. 4, the RRAST@Cmd signal becomes active for the second refresh activation at time T10 responsive to the deactivation of the RRTO@Cmd signal for the first refresh activation at time T8. The timing of when the RRAST@Cmd signal is activated relative to when the RRTO@Cmd signal is deactivated is based, at least in part, on the delay of the delay circuit 226. Thus, the timing of when a WL is activated for the second refresh activation relative to when a WL is deactivated for the first refresh activation is based, at least in part, on the delay of the delay circuit 226. In embodiments of the disclosure including a trimmable delay circuit 226, the delay may be changed by trimming, which may be used to set the time of when the WL is activated for the second refresh activation relative to when the WL is deactivated for the first refresh activation. In this manner, the time for circuits to be prepared for refreshing memory cells during the subsequent refresh activation following a previous refresh activation of a refresh operation may be set by trimming the delay circuit 226.

The activation and deactivation of the control signals as provided by the row control circuits 230, the refresh control circuit 260, and the command control circuit 220 for the remainder of the second refresh activation are similar to the activation and deactivation of the control signals as previously described for the first refresh activation. For example, activation of the RRTO@Bank signals, RRTO@Cmd signals, and RRTO_dly signals at times T12, T13, and T14, respectively, are similar as previously described for activation of the RRTO@Bank signals, RRTO@Cmd signals, and RRTO_dly signals at times T2, T3, and T4, respectively. Additionally, deactivation of the RRAST@Cmd signals, RRAST@Bank signals, the WL, and the RRTO@Bank, RRTO@Cmd, and RRTO_dly signals, at times T15, T16, T17, T18, and T19, respectively, are similar as previously described for deactivation of the RRAST@Cmd signals, RRAST@Bank signals, the WL, and the RRTO@Bank, RRTO@Cmd, and RRTO_dly signals, at times T5, T6, T7, T8, and T9, respectively. A detailed description of the operation of the row control circuits 230, the refresh control circuit 260, and the command control circuit 220 and the various control signals for the remainder of the second refresh activation will not be provided for the sake of brevity.

Following the deactivation of the RRTO signals for the second refresh activation at times T17, T18, and T19, the refresh operation including multiple refresh activations during the refresh cycle is complete.

As previously described, the example per bank refresh operation described with reference to FIG. 4 includes multiple refresh activations. A subsequent refresh activation is started based on deactivation of the RRTO@Cmd signal. However, in some embodiments of the disclosure the second refresh activation is started based on deactivation of another one or more of the RRTO signals. For example, in some embodiments of the disclosure, the second refresh activation is started based on deactivation of the RRTO_dly signal. The second refresh activation may be started based on deactivation of another one (or more) of the RRTO signals in other embodiments of the disclosure.

Figure 5:
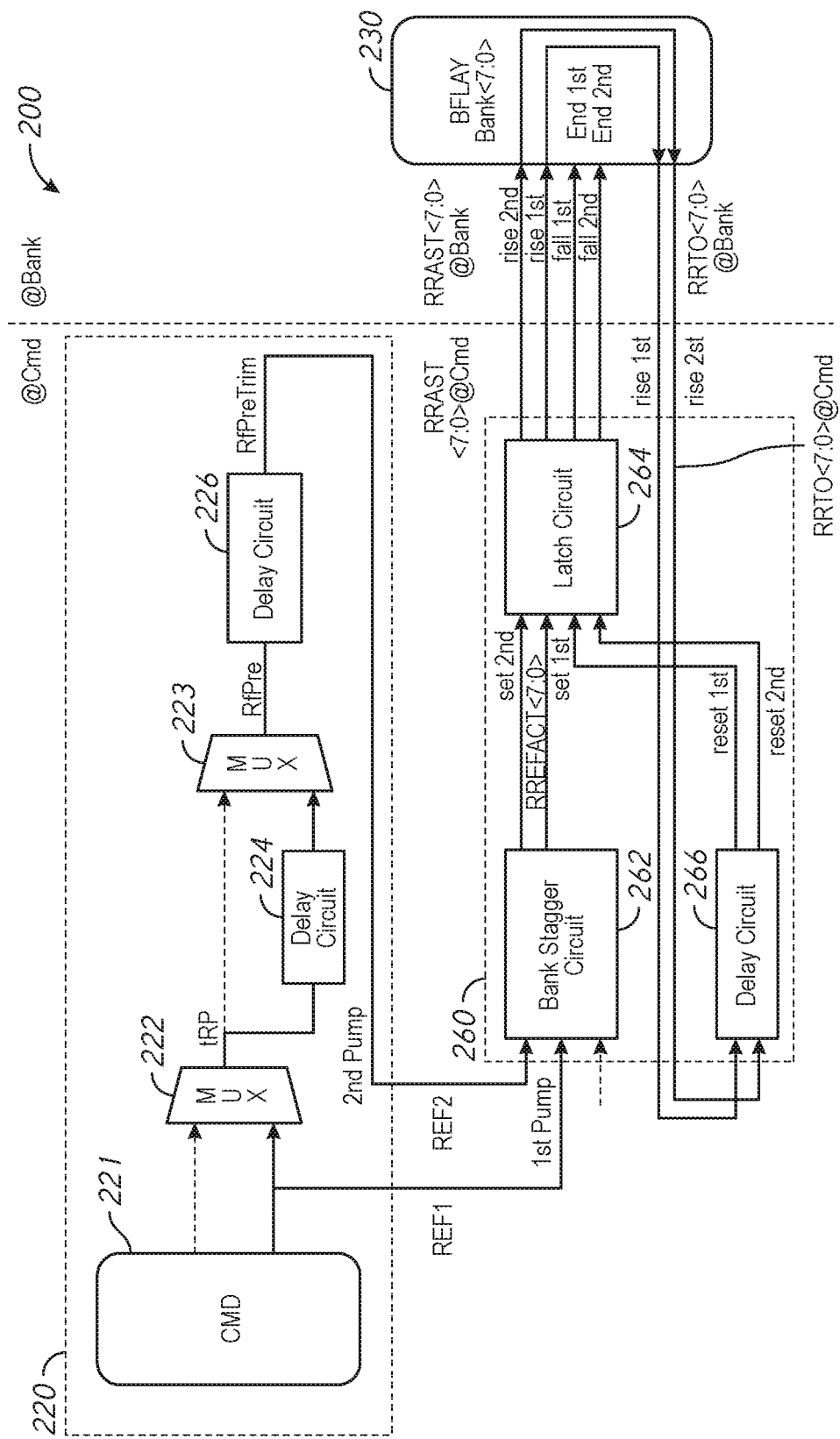
FIG. 5 is a diagram of various control signals of a refresh control path for an all-bank auto refresh operation according to an embodiment of the disclosure.
Figure 6:
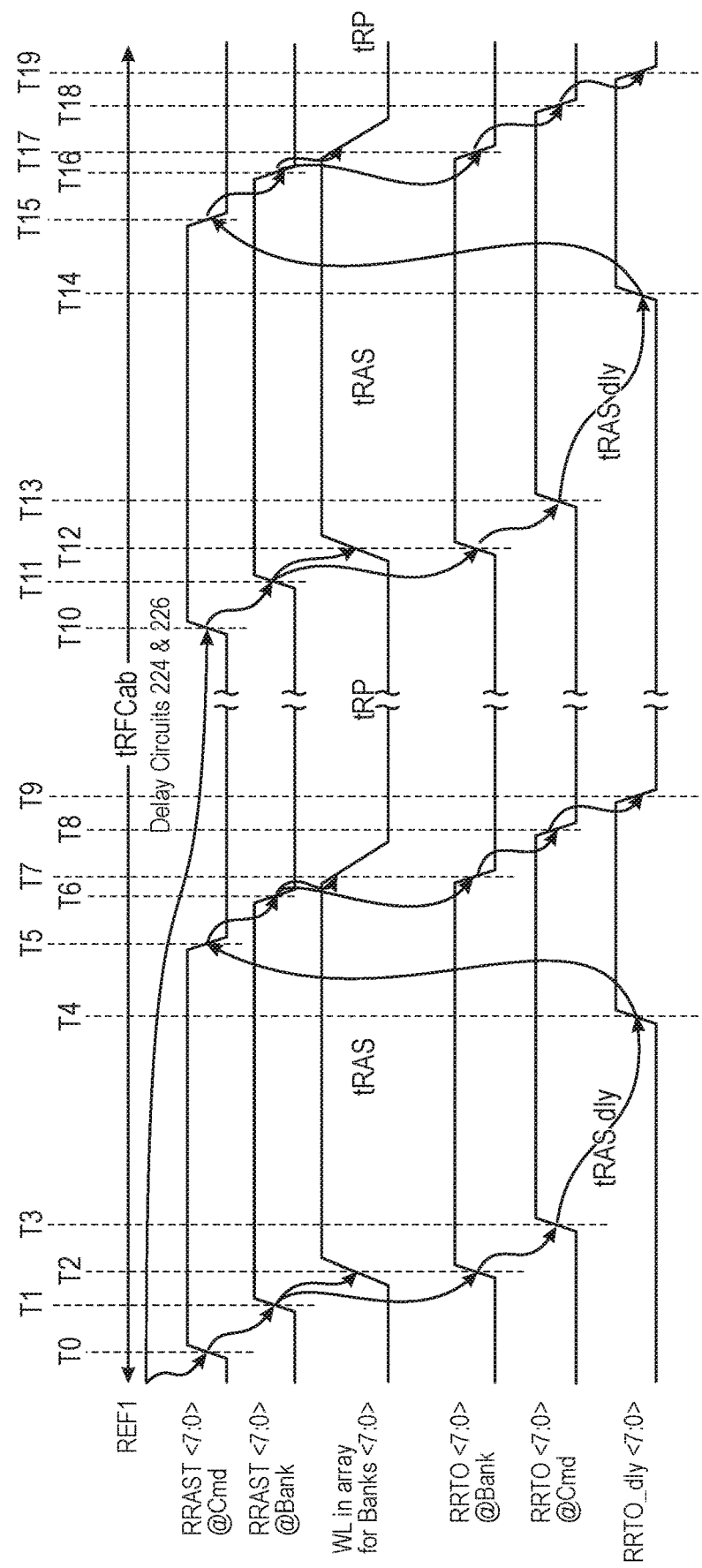
FIG. 6 is a timing diagram of various control signals of a refresh control path for an all-bank auto refresh operation according to an embodiment of the disclosure.
Figure 7:
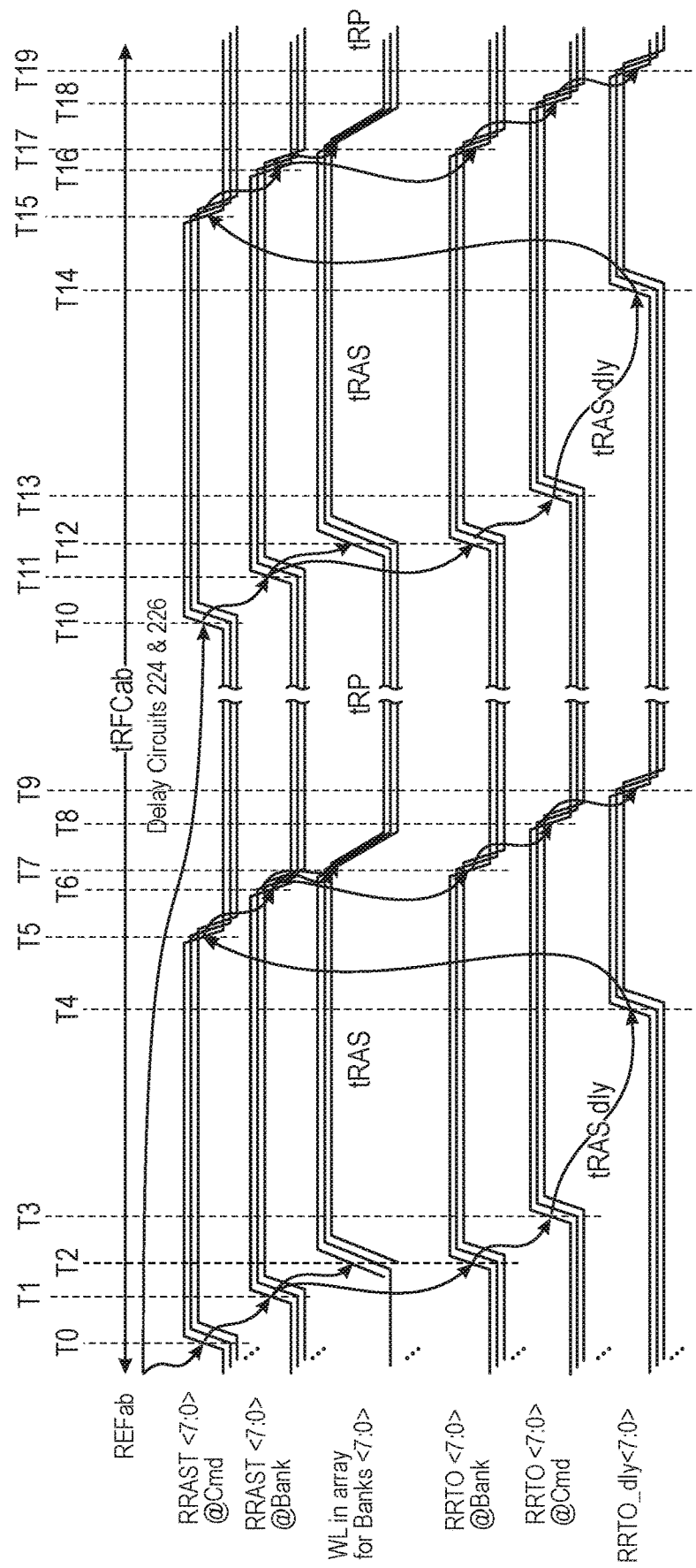
FIG. 7 is another timing diagram of various control signals of a refresh controlpath for an all-bank refresh operation according to an embodiment of the disclosure.

An all-bank auto refresh operation according to an embodiment of the disclosure will be described with reference to FIGS. 5-7. FIG. 5 is a diagram of various control signals of a refresh control path for an all-bank auto refresh operation according to an embodiment of the disclosure. FIG. 6 is a timing diagram of the various control signals of the refresh control path according to an embodiment of the disclosure. FIG. 7 is another timing diagram of the various control signals of the refresh control path according to an embodiment of the disclosure. The example all-bank auto refresh operation of FIGS. 5-7 will be described with reference to the refresh control path 200. However, other refresh control paths may be used in some embodiments of the disclosure.

The all-bank refresh operation may be performed by the refresh control path 200 to refresh multiple memory banks. In some examples, the all-bank refresh operation may be performed by the refresh control path 200 to refresh all eight memory banks included in a memory array.

The all-bank refresh operation performed by the refresh control path 200 may be a double-pump per bank refresh operation including a first refresh activation (e.g., first refresh "pump") and a second refresh activation (e.g., second refresh "pump").

In operation, an all-bank bank refresh operation is initiated when a decoded all-bank refresh command causes the command circuit 221 of the command control circuit 220 to provide an active REF1 signal to the bank stagger circuit 262 of the refresh control circuit 260. The active REF1 signal causes the bank stagger circuit 262 to provide staggered active RREFACT signals (with stagger due to the all-bank refresh operation). The staggered active RREFACT signals are provided to respective ones of the latch circuits 264. The active RREFACT signals cause the respective latch circuits 264 to provide active RRAST@Cmd signals (shown as RRAST<7:0>@Cmd). The respective staggered RREFACT signals are provided to the respective latch circuits 264, to provide the RRAST@Cmd signals that may be staggered (shown as RRAST<7:0>@Cmd). FIG. 6 shows control signals associated with refreshing memory of a memory bank. In some embodiments, the control signals associated with refreshing memory may be staggered for multiple memory banks, as shown in FIG. 7. The staggered control signals for the all-bank refresh operation may reduce peak power consumption by distributing the refresh operations over time, rather than having refresh operations for the memory banks performed simultaneously.

The RRAST@Cmd signals are provided to respective ones of the row control circuits 230, which are received as respective RRAST@Bank signals (shown as RRAST<7:0>@Bank). The staggered RRAST@Cmd signals for a first refresh activation of an all-bank refresh operation become active following time T0 and the respective RRAST@Bank signals become active following time T1.

The active RRAST@Bank signals cause the row control circuits 230 to refresh one or more memory cells (e.g., rows of memory cells) in corresponding memory banks. Word lines WL become active following time T2 to refresh one or more memory cells of all of the respective memory banks. The activation of the word lines WL following time T2 represents refreshing the memory cells for the first refresh activation. The staggered active RRAST@Bank signals also cause the row control circuits 230 to provide respective active RRTO@Bank signals to the delay circuit 266 following time T2, which are received by the delay circuit 266 as respective active RRTO@Cmd signals following time T3 (shown as RRTO<7:0>@Cmd and RRTO<7:0n>@Bank). The active RRTO@Cmd signals are delayed by the delay circuit 266 to provide the respective RRTO_dly signals (shown as RRTO_dly<7:0>) corresponding to the respective active RRTO@Cmd signals. The RRTO_dly signals become active following time T4, after a delay of tRAS dly relative to when the respective RRTO@Cmd signals become active following time T3. As previously described, the delay circuit 266 may be a trimmable delay in some embodiments of the disclosure, which may be trimmed to provide a desirable tRAS dly delay. The RRTO_dly signals are provided by the delay circuit 266 to the latch circuits 264, and the active RRTO_dly signals reset respective ones of the latch circuits 264. As a result, the reset latch circuits 264 provide respective RRAST@Cmd signals that change from an active level to an inactive level following time T5. The active-to-inactive RRAST@Cmd signals are received by the respective row control circuits 230 as respective RRAST@Bank signals which change from an active level to an inactive level, as shown following time T6. The inactive RRAST@Bank signals cause the respective row control circuit 230 to deactivate the respective activated word lines WL following time T7 to end the memory cell refresh of the first refresh activation. The inactive RRAST@Bank signals also cause the respective row control circuit 230 to provide respective RRTO@Bank signals that change following time T7 to an inactive level. The inactive RRTO@Bank signals are received by the delay circuit 266 as respective inactive RRTO@Cmd signals following time T8. The delay circuit 266, in turn, provides respective RRTO_dly signals that change to an inactive level following time T9.

In some embodiments of the disclosure, the delay circuit 266 does not delay a falling edge (e.g., active-to-inactive transition) when providing the RRTO_dly signals. In such embodiments, the transition of the RRTO_dly signals to an inactive level responsive to the falling edge of the respective RRTO@Cmd signals is not delayed to the same extent as the earlier transition of the respective RRTO_dly signals to an active level responsive to the rising edge of the respective RRTO@Cmd signals (e.g., compare delay between times T8 and T9 for the falling edge to delay between times T3 and T4 for the rising edge).

Following the deactivation of all of the RRTO signals (e.g., RRTO@Bank, RRTO@Cmd, and/or RRTO_dly), a second refresh activation will be started. In the example operation described with reference to the timing diagram of FIGS. 6 and 7, when the all-bank refresh operation is started by the active REF1 signal provided to the bank stagger circuit 262, the active REF1 signal is also provided to the multiplexer 222. The multiplexer 222 is controlled to provide the REF1 signal as the tRP signal due to the all-bank refresh operation. The tRP signal is provided to the delay circuit 224, which delays the tRP signal. During the delay of the tRP signal, all of the memory banks may be refreshed during the first refresh activation.

The delay circuit 224 provides the delayed tRP signal to the multiplexer 223. The multiplexer 223 is controlled to provide the delayed active tRP signal as an active RfPre signal due to the all-bank refresh operation. The RfPre signal is provided to the delay circuit 226, which delays the active RfPre signal to provide an active RfPreTrim signal. In some embodiments of the disclosure, the delay of the delay circuit 226 provides the RfPreTrim signal with a timing that provides time between consecutive refresh activations (e.g., time between the first and second refresh activations) to prepare circuits for subsequent refresh operations. As previously described, the delay circuit 226 may be a trimmable delay in some embodiments of the disclosure, which may be trimmed to provide a desirable tRP dly delay.

The active RfPreTrim signal is provided by the delay circuit 226 to the bank stagger circuit 262 of the refresh control circuit as an active second refresh control signal REF2. The delay circuit 224 provides a delay that is longer than the trimmable delay provided by the delay circuit 226. In some embodiments of the disclosure, the delay provided by the delay circuit 224. In some embodiments of the disclosure, the delay circuit 224 may have a delay that provides the active REF2 signal at a time relative to the active REF1 signal to allow refresh operations for the first refresh activation to be completed before starting refresh operations for the second refresh activation.

The active REF2 signal causes the bank stagger circuit 262 to provide staggered active RREFACT signals. The bank stagger circuit 262 may provide the staggered active RREFACT signals to respective ones of the latch circuits 264. The respective active RREFEACT signals may cause the respective latch circuit 264 to provide respective active RRAST@Cmd signals. The active RRAST@Cmd signals for a second refresh activation of an all-bank refresh operation are shown in FIGS. 6 and 7 following time T10. Each of the RRAST@Cmd signals is provided by the latch circuits 264 to a respective one of the row control circuits 230, which is received as a respective RRAST@Bank signal. The RRAST@Bank signals are shown becoming active following time T11. The active RRAST@Bank signals cause the row control circuits 230 to refresh one or more memory cells (e.g., rows of memory cells) in the corresponding memory banks. The activation of the word lines WL following time T12 represents refreshing one or more memory cells of all of the respective memory banks for the second activation.

Word lines WL for the all-bank refresh operation are activated for the second refresh activation at a time (e.g., following time T12) relative to the deactivation of word lines WL for the first refresh activation (e.g., following time T7) that provides time tRP to prepare circuits for refreshing memory cells during the second refresh activation. For example, the time between deactivation of the word lines WL for the first refresh activation and subsequent activation of the word lines WL for the second refresh activation may provide time for circuits to precharge and equalize bit lines and sense amplifiers, perform threshold voltage compensation for the sense amplifier, as well as perform other operations in preparation for refreshing memory cells.

The timing of the activation of the word lines WL for the second refresh activation for the all-bank refresh operation relative to deactivation of the word lines WL, for the first refresh activation for the all-bank refresh operation is based on when the second refresh activation begins. For example, the timing of activating the word lines WL (e.g., following time T12) is based on the timing of when the RRAST@Cmd signals become active (e.g., following time T10). The time when the RRAST@Cmd signals become active is relative to when the REF1 signal is provided to the multiplexer 222, as delayed by the delay circuit 224 and the delay circuit 226. Thus, controlling the timing of when the RRAST@Cmd signals become active for a subsequent refresh activation using the delay circuits 224 and 226 controls a timing of when the word lines WL are activated for the subsequent refresh activation relative to when the word lines WL are deactivated for the previous refresh activation.

For example, as previously described in the example operation described with reference to FIGS. 6 and 7, the RRAST@Cmd signals become active for the second refresh activation for the all-bank refresh operation following time T10 responsive to an active REF2 signal. The active RRAST@Cmd signals (as active RRAST@Bank signals) cause the row control circuits to activate word lines WL following time T12. The REF2 signal becomes active by delaying an active REF1 signal through delay circuit 224 and the delay circuit 226. As a result, increasing the delay of the delay circuit 224 and/or delay circuit 226 will increase a time between deactivation of the word lines for the first refresh activation and activation of the word lines for the second refresh activation, whereas decreasing the delay of the delay circuit 224 and/or delay circuit 226 will decrease a time between deactivation of the word lines for the first refresh activation and activation of the word lines for the second refresh activation.

Thus, the timing of when word lines WL are activated for the second refresh activation relative to when word lines WL are deactivated for the first refresh activation is based, at least in part, on the total delay provided by the delay circuits 224 and 226. In embodiments of the disclosure including a trimmable delay circuit 226, the total delay may be changed by trimming, which may be used to set the time of when the word lines WL are activated for the second refresh activation relative to when the word lines WL are deactivated for the first refresh activation. In this manner, the time for circuits to be prepared for refreshing memory cells during the subsequent refresh activation following a previous refresh activation of a refresh operation may be set by trimming the delay circuit 226.

The activation and deactivation of the control signals for the all-bank refresh operation as provided by the row control circuits 230, the refresh control circuit 260, and the command control circuit 220 for the remainder of the second refresh activation are similar to the activation and deactivation of the control signals as previously described for the first refresh activation. For example, activation of the RRTO@Bank signals, RRTO@Cmd signals, and RRTO_dly signals following times T12, T13, and T14, respectively, are similar as previously described for activation of the RRTO@Bank signals, RRTO@Cmd signals, and RRTO_dly signals following times T2, T3, and T4, respectively. Additionally, deactivation of the RRAST@Cmd signals, RRAST@Bank signals, the word lines WL, and the RRTO@Bank, RRTO@Cmd, and RRTO_dly signals, following times T15, T16, T17, T18, and T19, respectively, are similar as previously described for deactivation of the RRAST@Cmd signals, RRAST@Bank signals, the word lines WL, and the RRTO@Bank, RRTO@Cmd, and RRTO_dly signals, following times T5, T6, T7, T8, and T9, respectively. A detailed description of the operation of the row control circuits 230, the refresh control circuit 260, and the command control circuit 220 and the various control signals for the remainder of the second refresh activation will not be provided for the sake of brevity.

Following the deactivation of the RRTO signals for the second refresh activation for the all-bank refresh operation following times T17, T18, and T19, the refresh operation including multiple refresh activations during the refresh cycle is complete.

As previously described, the example all-bank auto refresh operation described with reference to FIGS. 6 and 7 includes multiple refresh activations. A subsequent refresh activation is started based on a total delay (e.g., total delay provided by delay circuits 224 and 226) following activation of a previous refresh activation (e.g., responsive to the active REF1 signal).

The per bank and all-bank refresh operations may include multiple refresh activations (multiple pumps). Timing of activating a subsequent refresh activation relative to a previous refresh activation for a per bank refresh operation is different than for an all-bank refresh operation in some embodiments of the disclosure. For example, with reference to per bank refresh operations, timing of a subsequent refresh activation may be based on completion of a previous refresh activation. In a particular example, a subsequent refresh activation is started based on deactivation of control signals related to completion of a previous refresh activation (e.g., deactivation of RRTO signals from a previous refresh activation). In contrast, with reference to all-bank refresh operations, timing of a subsequent refresh activation may be based on starting a previous refresh activation. In a particular example, a subsequent refresh activation is started following a delay relative to starting a previous refresh activation (e.g., activation of the REF2 signal after a delay relative to activation of the REF1 signal). In other words, timing of activating a subsequent refresh activation relative to a previous refresh activation for a per bank refresh operation may be responsive to RRTO signals; and timing of activating a subsequent refresh activation relative to a previous refresh activation for an all-bank refresh operation may be responsive to the delayed REF1 signal instead of the RRTO signals.

For per bank refresh operations, a delay of a delay circuit (e.g., delay circuit 226) may be adjusted to set a timing when to start a subsequent refresh activation relative to completion of a previous refresh activation. For all-bank refresh operations, a total delay of one or more delay circuits (e.g., delay circuits 224 and 226) may be adjusted to set a timing when to start a subsequent refresh activation relative to the start of a previous refresh activation. In some embodiments of the disclosure, the total delay for starting the second refresh activation for an all-bank refresh operation may include the delay for starting the second refresh activation for a per bank refresh operation. For example, with reference to FIG. 2, the delay circuit 226 provides a delay for timing the start of a second refresh activation relative to completion of a first refresh activation for per bank refresh operations. The delay for timing the start of the second refresh activation relative to the start of the first refresh activation for all-bank refresh operations is provided by both delay circuit 224 and delay circuit 226. Thus, the total delay for the all-bank refresh operations includes the delay for the per bank refresh operations.

Per bank and all-bank refresh operations including multiple refresh activations have been described. Embodiments of the disclosure may be used to provide the timing of starting subsequent refresh activations relative to previous refresh activations. Specific examples of per bank and all-bank refresh operations have been described as including two refresh activations. However, embodiments of the disclosure are not limited to two refresh activations. In some embodiments of the disclosure, per bank and all-bank refresh operations include greater than two refresh activations.

Figure 8:
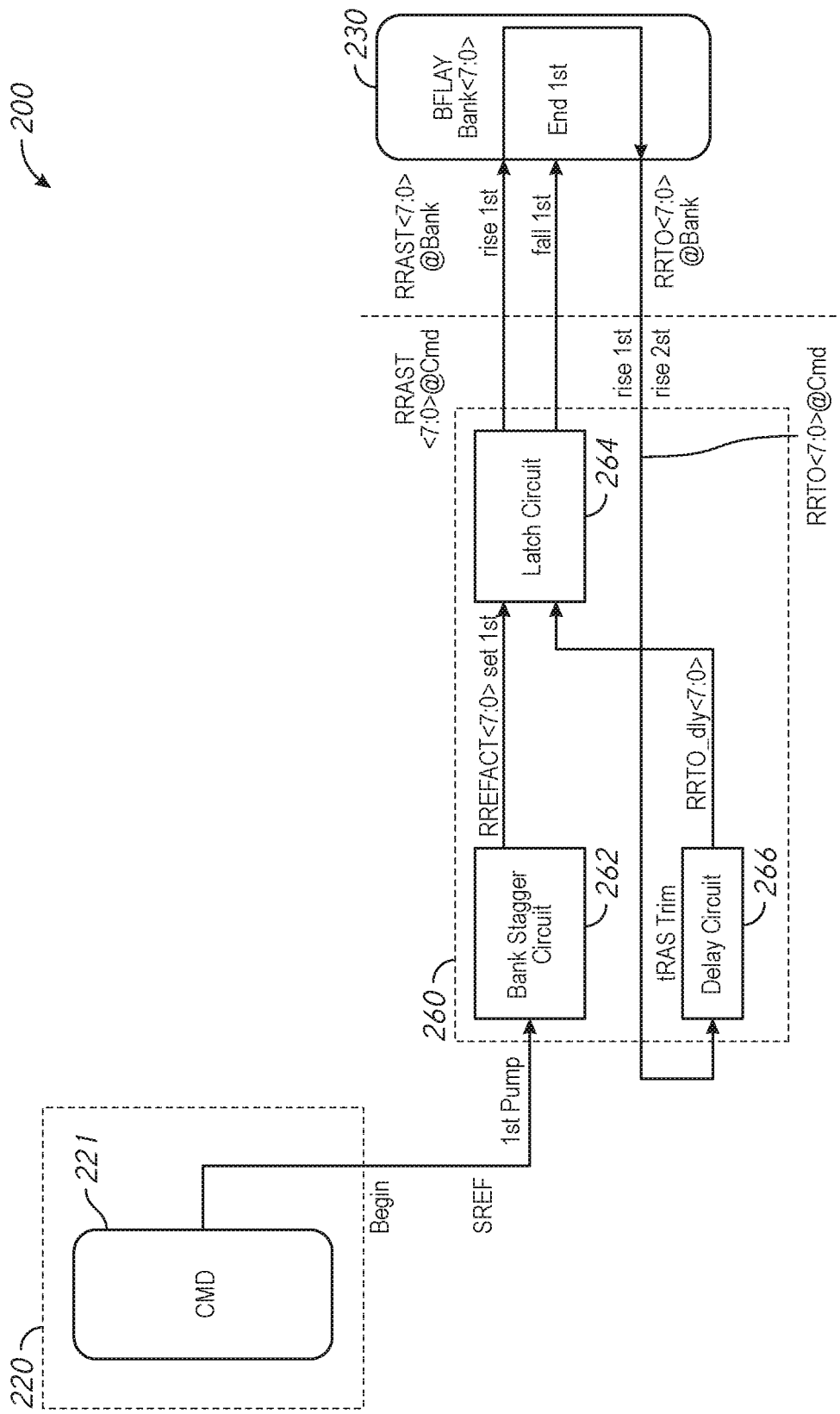
FIG. 8 is a diagram of various control signals of a refresh control path for a self-refresh operation according to an embodiment of the disclosure.
Figure 9:
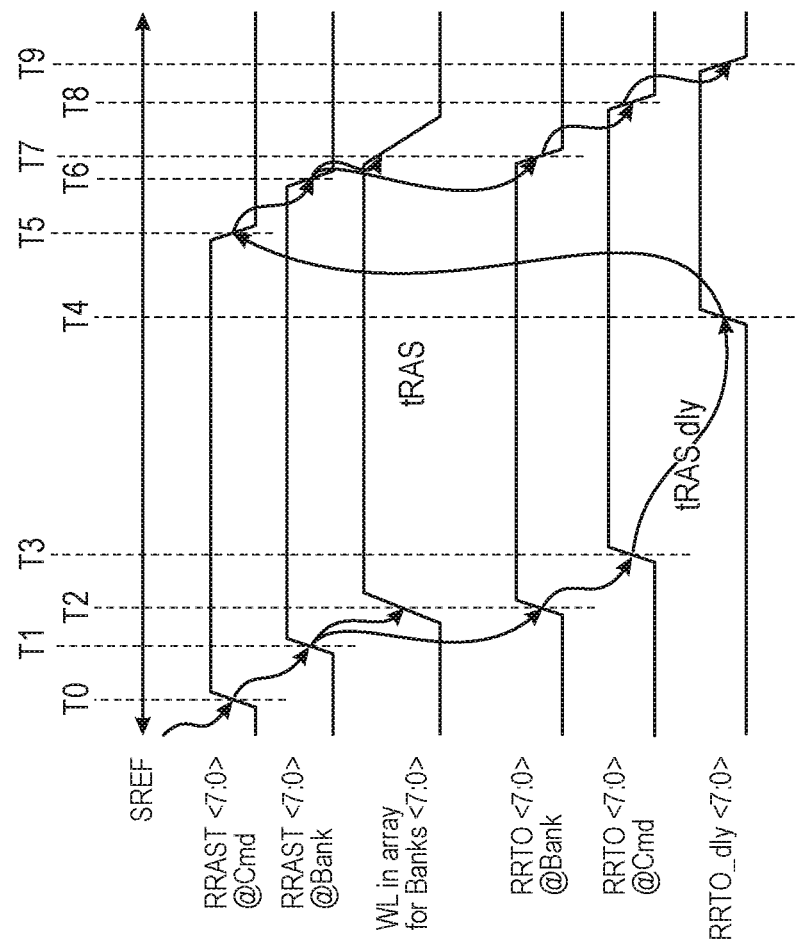
FIG. 9 is a timing diagram of various control signals of a refresh control path for an a self-refresh operation according to an embodiment of the disclosure.

A self-refresh operation according to an embodiment of the disclosure will be described with reference to FIGS. 8 and 9. FIG. 8 is a diagram of various control signals of a refresh control path for a self-refresh operation according to an embodiment of the disclosure. FIG. 9 is a timing diagram of the various control signals of the refresh control path according to an embodiment of the disclosure. The example self-refresh operation of FIGS. 8 and 9 will be described with reference to the refresh control path 200. However, other refresh control paths may be used in some embodiments of the disclosure. During the self-refresh operation, one or more word lines WL in all memory banks may be refreshed. The self-refresh operation performed by the refresh control path 200 may include a single refresh activation (e.g., single pump refresh).

The self-refresh operation may be performed by the refresh control path 200 to refresh multiple memory banks. In some examples, the self-refresh operation may be performed by the refresh control path 200 to refresh all eight memory banks included in a memory array. Some embodiments of the disclosure include different modes for self-refresh operations. For example, self-refresh operations may include a slow exit mode and a fast exit mode. In some embodiments of the disclosure, all memory banks are refreshed for the slow exit mode and for the fast exit mode. During the self-refresh operation, all memory banks may be refreshed in the slow exit mode and in the fast exit mode. An amount of time for the self-refresh operation being performed in the slow exit mode may be larger than an amount of time for the self-refresh operation being performed in the fast exit mode. An amount of time for the self-refresh operation being performed in the slow exit mode or in the in the fast exit mode may be larger than a maximum amount of time.

In operation, a self-refresh operation is initiated when, responsive to an oscillator signal produced by an oscillator, the command control circuit 220 provides an active SREF signal to the bank stagger circuit 262 of the refresh control circuit 260. The active SREF signal causes the bank stagger circuit 262 to provide staggered active RREFACT signals (with stagger due to the self-refresh operation). The staggered active RREFACT signals are provided to respective ones of the latch circuits 264. The active RREFACT signals cause the respective latch circuits 264 to provide active RRAST@Cmd signals (shown as RRAST<7:0>@Cmd). The respective staggered RREFACT signals are provided to the respective latch circuits 264, to provide the RRAST@Cmd signals that may be staggered (shown as RRAST<7:0>@Cmd). FIG. 9 shows control signals associated with refreshing memory of a memory bank. In some embodiments, the control signals associated with refreshing memory of a memory bank are provided by the bank stagger circuit 262 for each of the respective memory banks, but are staggered for refreshing memory for multiple memory banks. The staggered control signals for the self-refresh operation may reduce peak power consumption by distributing the refresh operations over time, rather than having refresh operations for the memory banks performed simultaneously.

The RRAST@Cmd signals are provided to respective ones of the row control circuits 230, which are received as respective RRAST@Bank signals (shown as RRAST<7:0>@Bank). The staggered RRAST@Cmd signals for one refresh activation of the self-refresh operation become active following time T0 and the respective RRAST@Bank signals become active following time T1.

The active RRAST@Bank signals cause the row control circuits 230 to refresh one or more memory cells (e.g., rows of memory cells) in corresponding memory banks. Word lines WL become active following time T2 to refresh one or more memory cells of all of the respective memory banks. The activation of the word lines WL following time T2 represents refreshing the memory cells for one refresh activation. The staggered active RRAST@Bank signals also cause the row control circuits 230 to provide respective active RRTO@Bank signals to the delay circuit 266 following time T2, which are received by the delay circuit 266 as respective active RRTO@Cmd signals following time T3 (shown as RRTO<7:0>@Cmd and RRTO<7:0n>@Bank).

The active RRTO@Cmd signals are delayed by the delay circuit 266 to provide the respective RRTO_dly signals (shown as RRTO_dly<7:0>) corresponding to the respective active RRTO@Cmd signals. The RRTO_dly signals become active following time T4, after a delay of tRAS dly relative to when the respective RRTO@Cmd signals become active following time T3. As previously described, the delay circuit 266 may be a trimmable delay in some embodiments of the disclosure, which may be trimmed to provide a desirable tRAS dly delay. The RRTO_dly signals are provided by the delay circuit 266 to the latch circuits 264, and the active RRTO_dly signals reset respective ones of the latch circuits 264. As a result, the reset latch circuits 264 provide respective RRAST@Cmd signals that change from an active level to an inactive level following time T5. The active-to-inactive RRAST@Cmd signals are received by the respective row control circuits 230 as respective RRAST@Bank signals which change from an active level to an inactive level, as shown following time T6. The inactive RRAST@Bank signals cause the respective row control circuits 230 to deactivate the respective activated word lines WL following time T7 to end the memory cell refresh of one refresh activation. The inactive RRAST@Bank signals also cause the respective row control circuits 230 to provide respective RRTO@Bank signals that change following time T7 to an inactive level. The inactive RRTO@Bank signals are received by the delay circuit 266 as respective inactive RRTO@Cmd signals following time T8. The delay circuit 266, in turn, provides respective RRTO_dly signals that change to an inactive level following time T9. The self-refresh operation may conclude after the RRTO_dly signals change to an inactive level. In some embodiments of the disclosure, the delay circuit 266 does not delay a falling edge (e.g., active-to-inactive transition) when providing the RRTO_dly signal. In such embodiments, the transition of the RRTO_dly signal to an inactive level responsive to the falling edge of the RRTO@Cmd signal is not delayed to the same extent as the earlier transition of the RRTO_dly signal to an active level responsive to the rising edge of the RRTO@Cmd signal (e.g., compare delay between times T8 and T9 for the falling edge to delay between times T3 and T4 for the rising edge).

For example, although the delay circuit 266 may be included in the refresh control circuit 260 to provide the timing for the second refresh activation for the per bank auto refresh operation, and the delay circuits 224 and 226 may be included in the command control circuit 220 to provide the timing for the second refresh activation for the all-bank auto refresh operation, circuitry is not required to provide timing or a delay for any refresh activations subsequent to the first refresh activation for the self-refresh operation.

As shown and described with reference to FIGS. 8 and 9, the self-refresh operation concludes based on the inactive RRTO_dly signals following time T9 and no subsequent refresh activations are performed in the refresh cycle. As a result, the self-refresh operation includes the single refresh activation. The self-refresh operation includes a different number of refresh activations than the auto refresh operation. For example, in some embodiments of the disclosure, the self-refresh operation may have one refresh activation (single pump) instead of two refresh activations (double pump). Because the self-refresh operation is used in a system that also uses the per bank or all-bank auto refresh operation with the double refresh activation, the self-refresh operation may include one refresh activation within the refresh cycle. Any additional refresh activations that may be advantageously "hidden" in the refresh cycle to refresh memory affected by a row hammer effect may be provided in the per bank and/or all-bank refresh operations. As a result, additional circuits are unnecessary to interrupt refreshing, or to suppress an internal command for a second refresh activation for self-refresh operations. The self-refresh operations are unlike each of the per bank auto refresh operation and the all-bank auto refresh operation, which utilize circuits for timing the activation of the word lines WL of the second refresh activation after the first refresh activation ends.

The per bank or all-bank auto refresh operation, but not the self-refresh operation, requires circuitry to determine timing for a second refresh activation relative to when the first refresh activation ends. As previously described in the example operation described with reference to FIG. 9, the RRAST@Cmd signals for the self-refresh operation become active for the first refresh activation following time T0 responsive to an active SREF signal. As previously described in the example operation described with reference to FIG. 4, the RRAST@Cmd signals for the all-bank auto refresh operation become active for the second refresh activation following time T10 responsive to an inactive RRTO@Cmd signal. As previously described in the example operation described with reference to FIG. 6, the RRAST@Cmd signals for the second refresh activation become active for the all-bank auto refresh operation following time T10 responsive to an active REF2 signal.

Thus, timing for a self-refresh operation of activating a subsequent refresh activation relative to a previous refresh activation is not required as it is for a per bank refresh or an all-bank auto refresh operation. With reference to per bank auto refresh operations timing of a subsequent refresh activation may be based on completion of a previous refresh activation; and, with reference to all-bank auto refresh operations, timing of a subsequent refresh activation may be based on starting a previous refresh activation.

In some embodiments of the disclosure, additional refresh activations that may be advantageously "hidden" in the refresh cycle for the per bank and all-bank auto refresh operations instead of in the self-refresh operation, may be used to refresh memory affected by a row hammer effect. The time for the self-refresh operation for the slow exit mode or the fast exit mode may be less than the maximum amount of time allotted for the self-refresh operation is due to the absence of interruptions for performing row hammer refresh operations. Instead of performing row hammer refresh operations during the self-refresh operation, the per bank and all-bank auto refresh operations include double refresh activations, and the second refresh activation for the per bank and all-bank auto refresh operations may be used for row hammer refresh operations. Circuits used to abort a self-refresh operation during the slow exit mode are not required due to a total time for the self-refresh operation for the slow exit mode or the fast exit mode being less than a maximum amount of time allotted for the self-refresh operation.

For per bank auto refresh operations, a delay of a delay circuit (e.g., delay circuit 226) may be adjusted to set a timing when to start a subsequent refresh activation relative to completion of a previous refresh activation. For the all-bank auto refresh operations, a total delay of one or more delay circuits (e.g., delay circuits 224 and 226) may be adjusted to set a timing when to start a subsequent refresh activation relative to the start of a previous refresh activation.

Specific examples of a self-refresh operation including one refresh activation, and per bank and all-bank auto refresh operations including multiple refresh activations have been described. However, embodiments of the disclosure are not limited to one refresh operation for the self-refresh operation and to two refresh activations for the per bank and all-bank auto refresh operations. In some embodiments of the disclosure, the self-refresh operation including one refresh activation may include greater than one refresh activation, and the per bank and all-bank auto refresh operations include greater than two refresh activations.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. A system, comprising:
    a memory array including a plurality of memory banks;
    a command address input circuit configured to provide a command for a refresh operation;
    a command control circuit comprising a first delay circuit and a second delay circuit, wherein the command control circuit is configured to receive the command, wherein, the command control circuit is further configured to provide a self-refresh internal control signal based on an oscillator signal, a first auto-refresh internal control signal in response to the received command, and a second auto-refresh internal control signal based on the first auto-refresh internal control signal selectively delayed by only the first delay circuit or delayed by both of the first and second delay circuits;
    a refresh control circuit configured to provide a first refresh control signal responsive to the self-refresh internal control signal, the first auto-refresh internal control signal, and the second auto-refresh internal control signal; and a row control circuit configured to receive the first refresh control signal, activate at least one wordline of a memory bank of the plurality of memory banks, and provide a second refresh control signal responsive to the first refresh control signal.

2. The system of claim 1, wherein one refresh activation is performed responsive to the self-refresh internal control signal for a self-refresh operation, and two refresh activations are performed responsive to the first and second and third auto-refresh internal control signals, respectively, for an auto refresh operation.

3. The system of claim 1, wherein the command control circuit is configured to provide the self-refresh internal control signal for timing of one refresh activation for a self-refresh operation.

4. The system of claim 1, wherein the command control circuit is configured to provide the first and second auto-refresh internal control signals for timing of two refresh activations, respectively, for an auto refresh operation.

5. The system of claim 4, wherein the auto refresh operation is a per bank or an all-bank refresh operation.

6. The system of claim 1, wherein the second auto-refresh internal control signal is based, directly or indirectly, on the first auto-refresh internal control signal.

7. The system of claim 1, wherein the second auto-refresh internal control signal is based on the second refresh control signal when the refresh operation is a per bank refresh operation, and is based on the first auto-refresh internal control signal delayed by the command control circuit when the refresh operation is an all-bank refresh operation.

8. The system of claim 1, wherein the row control circuit is further configured to refresh one or more memory cells in a corresponding memory bank of the plurality of memory banks when the command is received by the command control circuit for a per bank refresh operation.

9. The system of claim 1, wherein the row control circuit is further configured to refresh one or more memory cells in all memory banks of the plurality of memory banks when the command is received by the command control circuit for an all-bank refresh operation.

10. The system of claim 1, wherein the row control circuit is further configured to refresh one or more memory cells in less than all memory banks of the plurality of memory banks when the command is received by the command control circuit for a per bank refresh operation.

11. An apparatus, comprising:
a command control circuit configured to provide a first internal control signal, a second internal control signal, and a third internal control signal;
a refresh control circuit to receive the first internal control signal, the second internal control signal, and the third internal control signal, wherein the refresh control circuit is further configured to provide a first refresh control signal responsive to the first internal control signal, and to provide a plurality of second refresh control signals responsive to the second and third internal control signals; and
a row control circuit configured to:
receive, for a self-refresh operation, the first refresh control signal and activate at least one wordline of a memory bank of the plurality of memory banks responsive to the received first refresh control signal, and receive, for an auto refresh operation, the plurality of second refresh control signals and activate at least one wordline of a memory bank of the plurality of memory banks responsive to each of the plurality of second refresh control signals delayed by at least one delay circuit in the command control circuit.

12. The apparatus of claim 11, wherein, for the self-refresh operation, the refresh control circuit provides only a single signal as the first refresh control signal to the row control circuit in a refresh cycle.

13. The apparatus of claim 12, wherein the one first refresh control signal provided by the refresh control circuit to the row control circuit for the self-refresh operation is activated responsive to the first internal control signal and deactivated responsive to another refresh control signal provided by the row control circuit.

14. The apparatus of claim 11, wherein the plurality of two refresh control signals for the auto refresh operation includes two of the second refresh control signals, and the two of the second refresh control signals include a first control signal provided by the refresh control circuit to the row control circuit responsive to the second internal control signal, and further includes a second control signal provided by the refresh control circuit to the row control circuit after the at least one wordline of a memory bank of the plurality of memory banks is activated and subsequently deactivated.

15. The apparatus of claim 14, wherein, for a per bank refresh operation, the second control signal is provided by the refresh control circuit responsive to a third control signal provided by the row control circuit to the refresh control, circuit responsive to the first control signal.

16. The apparatus of claim 14, wherein, for an all-bank refresh operation, the second control signal is provided by the refresh control circuit responsive to the second internal control signal delayed by the command control circuit.

17. A method, comprising:
performing one of a self-refresh operation and an auto refresh operation responsive to a first internal control signal, a second internal control signal, and a third internal control signal;
performing, for the self-refresh operation, a first refresh operation responsive to an oscillator signal;
performing, for the auto refresh operation, the first refresh operation when a command is received and decoded, and the decoded command is associated with the auto refresh operation; and
performing, for the auto refresh operation, a second refresh operation after at least one wordline of a memory bank of the plurality of memory banks is activated and subsequently deactivated, wherein the second refresh operation is performed in response to a completion of the decoded command with a delay added by a delay circuit.

18. The method of claim 17, further comprising:
activating the first and second internal control signals for the self-refresh operation and the auto refresh operation, respectively; and
activating the third internal control signal for the auto refresh operation responsive to one of a refresh control signal and the second internal control signal.

19. The method of claim 17, further comprising:
activating, when the decoded command is associated with a per bank refresh operation, the third internal control signal responsive to a refresh control signal having a logic level indicative of completion of the first refresh operation.

20. The method of claim 17, further comprising:
activating, when the decoded command is associated with an all-bank refresh operation, the third internal control signal responsive to a delayed active first internal control signal.

* * * * *

UNITED STATES PATENT AND TRADEMARK OFFICE
CERTIFICATE OF CORRECTION

Page 1 of 1

PATENT NO. : 11,037,616 B2
APPLICATION NO. : 16/220215
DATED : June 15, 2021
INVENTOR(S) : Toru Ishikawa, Shinji Bessho and Takuya Nakanishi It is certified that error appears in the above-identified patent and that said Letters Patent is hereby corrected as shown below:

In the Claims

| | Reads | Should Read |
|---|---|---|
| Column 21, Line 13, Claim 2 | "the first and second and third auto-refresh internal control signals" | -- the first and second suto-refresh internal control signals -- |

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*